(12) United States Patent
Rychlak

(10) Patent No.: US 6,696,987 B1
(45) Date of Patent: Feb. 24, 2004

(54) ELECTRONIC DEVICE WITH ILLUMINATED OPERATOR BUTTON, THE ACTIVATION OF SAID OPERATOR BUTTONS BEING DETERMINED BY DETECTION OF THE CHANGE IN THE LUMINOUS REFLECTANCE

(75) Inventor: Stefan Rychlak, Ilsede (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,736

(22) PCT Filed: Oct. 20, 1998

(86) PCT No.: PCT/DE98/03070

§ 371 (c)(1),
(2), (4) Date: Dec. 18, 2000

(87) PCT Pub. No.: WO99/45649

PCT Pub. Date: Oct. 10, 1999

(30) Foreign Application Priority Data

Mar. 7, 1998 (DE) .......................................... 198 09 886

(51) Int. Cl.[7] ........................ H03K 17/94; H03M 11/00
(52) U.S. Cl. ........................... 341/31; 341/22; 250/215; 250/221
(58) Field of Search ..................... 341/22, 31; 250/215, 250/221; 340/825.25

(56) References Cited

U.S. PATENT DOCUMENTS 5,266,949 A * 11/1993 Rossi ........................... 341/22

FOREIGN PATENT DOCUMENTS

| DE | 36 11 988 | 10/1986 |
| DE | 196 32 334 | 9/1997 |
| DE | 195 15 051 | 10/1997 |
| EP | 0 448 826 | 10/1991 |

* cited by examiner

Primary Examiner—Timothy Edwards
(74) Attorney, Agent, or Firm—Kenyon & Kenyon

(57) ABSTRACT

With an electronic device, in particular a car radio that includes a microprocessor and operating buttons that can be illuminated by light sources, the functions of illumination and detecting an operating status of the operating buttons are linked together by the fact that the light sources can be supplied with control pulses cyclically in succession as controlled by the microprocessor. The operating buttons each have a light receiver arrangement, which can be connected optically to the light source and whose optical connection to the light source can be varied by operating the respective operating button. The microprocessor is equipped for an allocation of the output signals of the light receiver arrangements to the cyclically emitted pulses.

5 Claims, 2 Drawing Sheets

ELECTRONIC DEVICE WITH ILLUMINATED OPERATOR BUTTON, THE ACTIVATION OF SAID OPERATOR BUTTONS BEING DETERMINED BY DETECTION OF THE CHANGE IN THE LUMINOUS REFLECTANCE

FIELD OF THE INVENTION

The present invention relates to an electronic device, in particular a car radio, that has a microprocessor and operating buttons that can be lighted using light sources.

BACKGROUND INFORMATION

Such electronic devices are used in particular as consumer electronics equipment, which should be operable even in low light. The night design of car radios has the function of allowing the operating buttons to be located and operated in an essentially dark interior of an motor vehicle in the absence of daylight.

At the present time, operating buttons in car radios are usually designed as short-stroke jog keys with analysis of a switch pulse or through conducting rubber mats that establish constant contact and are responsible for the restoring force of the buttons.

The conventional operating buttons must have a reliable mechanical and electric design. Mechanical wear on contacts or the conducting rubber of the rubber mats is the deciding factor in the required service life of these buttons. To reliably achieve the required long service life, the operating buttons must have a relatively expensive design, so they are a cost-determining element that cannot be disregarded for car radios.

SUMMARY

An object of the present invention is to create a design for operating buttons of an electronic device that will permit a long service life of the operating buttons at a reduced cost.

This object is achieved according to the present invention by an electronic device in which the light sources can be supplied cyclically with control pulses in succession as controlled by the microprocessor; the operating buttons each have a light receiver arrangement optically connectable to the light source, such that its optical connection to the light source can be changed by operating the respective operating button; and the microprocessor is equipped for allocation of the output signals of the light receiver arrangements to the cyclically emitted pulses.

The lighting function for the operating buttons is combined with detection of button operation according to the present invention. In contrast with the implementations generally used for car radios and similar electronic devices, button operation is detected not electrically but instead with the help of the light used for illumination. To make this possible, this illumination light is generated in the form of light pulses in such rapid succession that the human eye perceives the illumination provided by each light source as being continuous. Such pulses in a high frequency cycle are distributed cyclically to the light sources as controlled by the microprocessor, so that one light source is assigned to each control pulse. Thus, on the basis of the output signals of the light receiver arrangements arriving at the microprocessor, the microprocessor can determine the instantaneous operating status of the operating buttons correlating with a certain control pulse; the microprocessor does this by determining whether a pulse of the light receiver arrangement corresponding to the output control pulse reaches its input. Within the scope of the arrangement according to the present invention, it is also readily possible to implement a dimmer function by varying the clock frequency of the microprocessor or by varying the pulse widths of the cyclically distributed control pulses.

In an advantageous embodiment of the present invention, the light sources are connected to outputs of a shift register, which is in turn connected to a clock pulse output of the microprocessor. The cyclic distribution of the control pulses takes place by way of the shift register which is clocked by the microprocessor. Furthermore, the shift register is connected to a reset output of the microprocessor, so that the shift register is reset to a defined starting state after scanning the operating buttons to guarantee secure allocation of clock pulse numbers of the microprocessor to the control pulses sequentially distributed to the individual light sources in succession by way of the shift register.

The light receiver arrangement of an operating button has a fiber-optic arrangement. This makes it possible to analyze received light from all the operating buttons jointly, e.g., by sending the light to a common optoelectric receiver, thus yielding a very simple and inexpensive analyzer arrangement.

A displacement motion of the operating button can be utilized for detection of the operating status of the operating button. It is also possible within the scope of the present invention to use operating buttons that can be operated without any displacement motion. In this case the reflectivity of the operating finger of a person operating the button can be used in a conventional manner in that the illuminating light emanating from the operating button is reflected by the operating finger into an end face of a fiber-optic cable. For specially shaped key depressions, it is also conceivable to establish a permanent optical connection between the light exit point and the end face of a fiber-optic arrangement, which is interrupted by a finger operating the operating button.

For a high reliability in detecting the operating status of the operating button with a very simple arrangement, a fiber-optic segment is arranged in each operating button for constantly receiving a light component of the light source, the operating button is displaceable for operation, and the displacement motion of the operating button causes displacement of the fiber-optic segment relative to a fiber-optic cable leading away from the operating button. Depending on the operating status of the operating button, the light collected by the fiber-optic segment is diverted in the fiber-optic cable or does not reach the fiber-optic cable. Since the optical fibers may be very thin, only a very small displacement motion is needed to be able to detect the operating status reliably. It is advantageous for the optical connection between the fiber-optic segment and the fiber-optic cable to be interrupted when the operating button is depressed, because in this way proper functioning of the arrangement can be checked by the microprocessor when the operating button is at rest.

DETAILED DESCRIPTION

Figure 1:
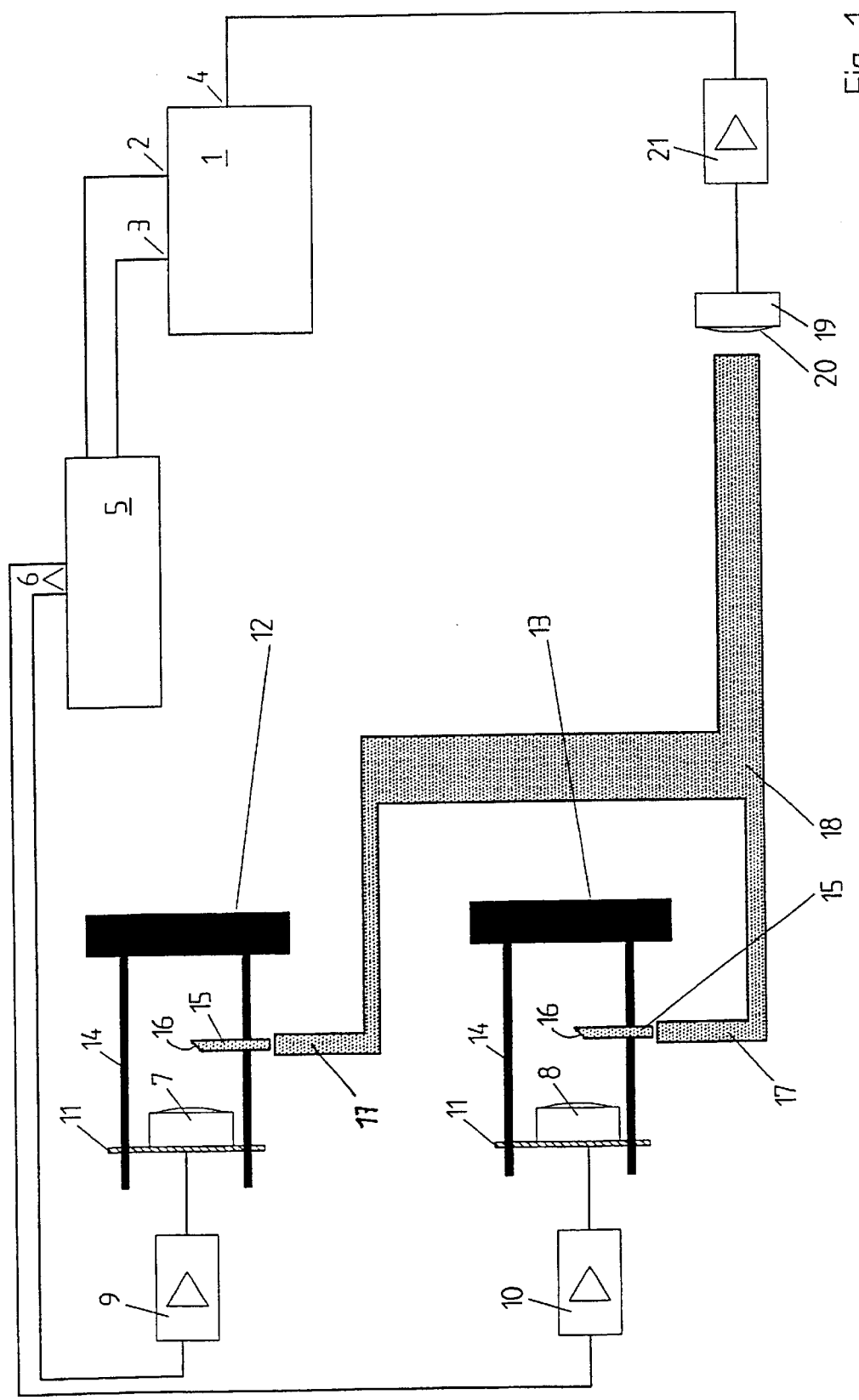
FIG. 1 shows a schematic diagram of an operating button arrangement that has two undepressed operating buttons.

FIG. 1 shows a microprocessor 1 that has a clock output 2 a reset output 3 an input 4. A shift register 5 having functionally allocated inputs is connected to the two outputs 2, 3. In the embodiment illustrated here, the shift register has two outputs 6, each connected to one light source 7, 8 over a respective amplifier 9, 10.

Light sources 7, 8 are designed as LEDs and are in a stationary mount on a circuit board 11, which may be a common circuit board. A first operating button 12 and a second operating button 13 are each provided with hollow cylindrical housing caps 14, which encompass respective light sources 7, 8 and provide guidance for displacement of operating buttons 12, 13 perpendicular to their operating surface, e.g., in combination with circuit board 11. Operating buttons 12, 13 are at least partially transparent at their surface to permit the illumination function. A fiber-optic segment 15 that has beveled end face 16 is inserted into each hollow cylindrical housing cap 14, collecting a portion of the light of light source 7, 8 and conducting it outward through an opening in hollow cylindrical housing cap 14. Fiber-optic segment 15 is displaceable with operating button 12, 13. In the resting position of both buttons 12, 13 illustrated in FIG. 1, a planar end face on the output end of fiber-optic segment 16 is flush with a planar end face of a fiber-optic cable 17 in a stationary mount, so that in the condition illustrated in FIG. 1, a portion of the pulsed light emitted by light sources 7, 8 is diverted over fiber-optic segment 16 and fiber-optic cable 17. Fiber-optic cables 17 are combined into a fiber-optic bundle 18 that ends here in front of a light-sensitive surface of an optoelectronic receiver 19, which for example is a phototransistor. This phototransistor is usually provided with a convergent lens 20 on its optical input end.

The electric output signal of optoelectric receiver 19 goes through an amplifier 21 to input 4 of microprocessor 1.

In the embodiment illustrated in FIG. 1, microprocessor 1 sends two clock pulses over clock output 2 to shift register 5, which thus conducts two pulses in succession to first light source 7 and second light source 8. Then microprocessor 1 sends a reset pulse to shift register 5 over reset output 3, resetting it to a defined starting condition that corresponds to the beginning of the cycle after the two pulses have been sent to two light sources 7, 8. During the emission of each of the two clock pulses over clock output 2, the microprocessor receives one pulse at input 4, so that microprocessor 1 can detect that both operating buttons 12, 13 are in the unoperated resting state.

Figure 2:
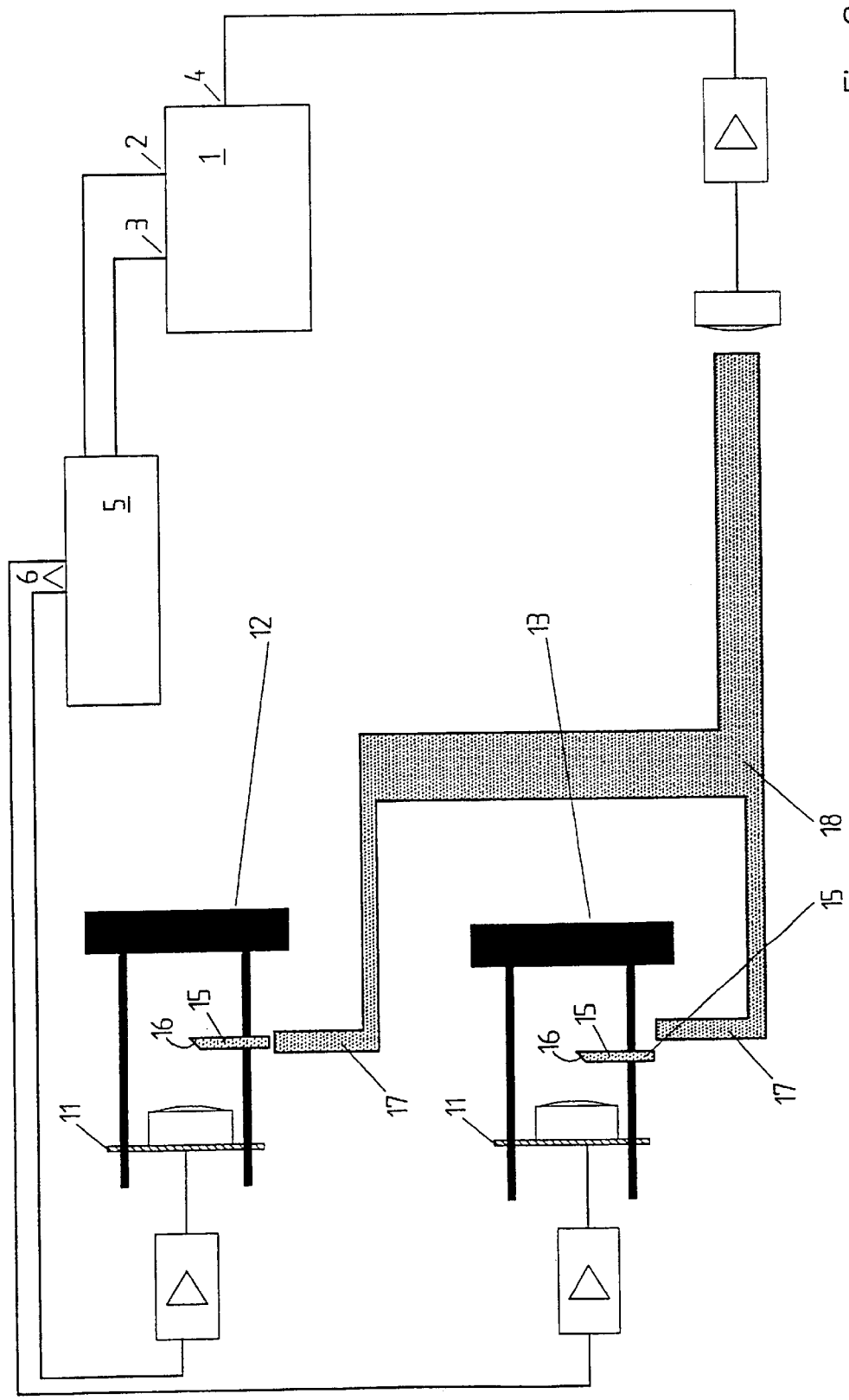
FIG. 2 shows a diagram of a depressed operating button according to FIG. 1.

In the embodiment illustrated in FIG. 2, only second operating button 13 has been operated. Accordingly, microprocessor 1 receives a pulse signal at its input 4 only when the first clock pulse is transmitted over clock output 2, but not when the second clock pulse of a cycle is sent. Thus, microprocessor 1 detects that first operating button 12 is in the unoperated resting state but second operating button 13 has been depressed.

Of course, the embodiment shown here can be expanded to any desired number of operating buttons. For example, if there are eight operating buttons, shift register 5 is designed with eight outputs, so that the microprocessor sends out eight clock pulses at clock output 2 before the reset pulse is sent over reset output 3 to shift register 5 to define the start of the next cycle.

What is claimed is:

1. An electronic device, comprising:

a microprocessor;

operating buttons, each of the operating buttons having a light source and a light receiver arrangement, each of the light sources being supplied with cyclical control pulses in succession controlled by the microprocessor, each of the light receiver arrangements providing an optical connection between one of the operating buttons and the respective light source and including a fiber-optic cable leading away from the one of the operating buttons, the optical connection being alterable by operation of the one of the operating buttons, the microprocessor being configured to allocate output signals of the light receiver arrangements to the cyclical control pulses, the operating buttons being displaceable for operation; and a fiber-optic segment connected to the operating buttons for continuous reception of a light component of the light source, displacement of the one of the operating buttons displacing the fiber-optic segment relative to the fiber-optic cable.

2. The electronic device according to claim 1, wherein:

the electronic device is a car radio.

3. The electronic device according to claim 1, further comprising:

an optoelectronic receiver, an output signal being connected to an input of the microprocessor, the light receiver arrangements of a plurality of the operating buttons ending together at a light-sensitive face of the optoelectronic receiver.

4. The electronic device according to claim 1, further comprising:

a shift register connected to a clock pulse output of the microprocessor, the light sources being connected to outputs of the shift register.

5. The electronic device according to claim 4, wherein:

the shift register is connected to a reset output of the microprocessor.

* * * * *